(12) United States Patent
Nagai et al.

(10) Patent No.: US 6,552,562 B2
(45) Date of Patent: Apr. 22, 2003

(54) CURRENT DETECTING APPARATUS AND ITS CONTROL METHOD

(75) Inventors: Tamiji Nagai, Kanagawa (JP); Tamon Ikeda, Tokyo (JP); Kazuo Yamazaki, Kanagawa (JP)

(73) Assignee: Sony Corporation (JP)

( * ) Notice: Subject to any disclaimer, the term of this patent is extended or adjusted under 35 U.S.C. 154(b) by 18 days.

(21) Appl. No.: 09/903,576

(22) Filed: Jul. 13, 2001

(65) Prior Publication Data

US 2002/0011867 A1 Jan. 31, 2002

(30) Foreign Application Priority Data

Jul. 24, 2000 (JP) ........................................ 2000-221642

(51) Int. Cl.[7] .............................................. G01R 31/26
(52) U.S. Cl. ........................................ 324/765; 327/378
(58) Field of Search ................................ 324/115, 131, 324/158.1, 522, 713, 765, 520; 323/352, 353, 354, 274; 327/378, 538, 540, 380; 361/93.9, 93.2, 86, 78, 18; 320/164, 162, 161, 159; 365/185.2, 185.21, 210

(56) References Cited

U.S. PATENT DOCUMENTS

| | | | |
|---|---|---|---|
| 3,699,422 A | | 10/1972 | Miller |
| 3,735,233 A | | 5/1973 | Ringle |
| 5,227,964 A | * | 7/1993 | Furuhata ........................ 363/56 |
| 5,563,541 A | * | 10/1996 | Koga et al. ................... 327/380 |
| 5,825,234 A | * | 10/1998 | Sung ............................. 327/378 |
| 6,483,684 B2 | * | 11/2002 | Isobe ........................... 361/93.9 |

FOREIGN PATENT DOCUMENTS

| | | |
|---|---|---|
| JP | 09-84280 | 3/1997 |
| JP | HEI 10-29338 | 3/1998 |

* cited by examiner

Primary Examiner—Kamand Cuneo
Assistant Examiner—Trung Nguyen
(74) Attorney, Agent, or Firm—Rader, Fishman & Grauer PLLC; Ronald P. Kanaen, Esq.

(57) ABSTRACT

To reduce errors and decrease loss, the detecting range of current is enlarged and the current is independently detectable. A rectified voltage and a rectified current are supplied from an input terminal. Resistors 1 and 2 are serially connected between the input and output terminals. A load is connected to the output terminal. Between an emitter and collector of the transistor are resistor 1 and a constant current detecting circuit 5. The transistor base is connected to a control circuit that controls the transistor switching operations. The constant current detecting circuit 5 detects current from the voltage across resistor 1. A current detecting circuit 6 detects current from the voltage across resistor 2. A signal is supplied to the control circuit when the constant current detecting circuit 5 detects small current. The control circuit supplies a signal to the transistor base that increases transistor impedance.

7 Claims, 16 Drawing Sheets

CURRENT DETECTING APPARATUS AND ITS CONTROL METHOD

BACKGROUND OF THE INVENTION

1. Field of the Invention

The invention relates to a current detecting apparatus which can precisely detect a current in a range from a small current to a large current and to a control method for such an apparatus.

2. Description of the Related Arts

Hitherto, as a method of detecting a current, an example of detecting a current by using two power sources having a potential difference has been disclosed in JP-A-10-28338 by the same applicant of the present invention. According to JP-A-10-28338, the method is intended to detect a value of a current at the time of charging a secondary battery. When the method is explained with reference to FIG. 19, a voltage E1 of a power source 201 and a voltage E2 of a power source 203 are set so that a potential difference is equal to ΔV. It is now assumed that the power source 201 can output a low voltage and a large current and the power source 203 can output a high voltage and a small current. A current is detected from a voltage across a resistor 202 having a small resistance value. A current is detected from a voltage across a resistor 204 having a large resistance value.

However, in the example of FIG. 19, there is a problem such that when the small current and the large current are detected, they exercise an influence on each other.

OBJECTS AND SUMMARY OF THE INVENTION

It is, therefore, an object of the invention to provide a current detecting apparatus in which since a detecting range of a current can be enlarged and the current can be independently detected, its influence can be minimized, errors can be reduced, and the loss can be decreased and to provide a control method of such an apparatus.

According to the first aspect of the invention, there is provided a current detecting apparatus comprising: a first resistor provided between an input terminal and an output terminal; first switching means provided in parallel with the first resistor; control means for controlling the switching means; first detecting means for detecting a current flowing in the first resistor or a potential difference which is caused in the first resistor; a second resistor provided so as to be serial to at least the first switching means; and second detecting means for detecting a current flowing in the second resistor or a potential difference which is caused in the second resistor, wherein the control means turns off the switching means when the current or potential difference that is equal to or larger than a first predetermined value is detected by the first detecting means and turns on the switching means when the current or potential difference that is equal to or smaller than a second predetermined value is detected by the second detecting means, and the first and second detecting means outputs the detected current or potential difference. According to the second aspect of the invention, there is provided a control method for a current detecting apparatus comprising: a first resistor provided between an input terminal and an output terminal; switching means provided in parallel with the first resistor; control means for controlling the switching means; first detecting means for detecting a current flowing in the first resistor or a potential difference which is caused in the first resistor; a second resistor provided so as to be serial to at least the switching means; and second detecting means for detecting a current flowing in the second resistor or a potential difference which is caused in the second resistor, wherein when the current or potential difference that is equal to or larger than a first predetermined value is detected by the first detecting means, the switching means is turned off, when the current or potential difference that is equal to or smaller than a second predetermined value is detected by the second detecting means, the switching means is turned on, and the first and second detecting means outputs the detected current or potential difference.

Owing to the switching means provided in parallel with the first register arranged between the input terminal and the output terminal, the current or potential difference that is obtained from the first resistor and the current or potential difference that is obtained from the second resistor can be detected so that the first and second resistors do not influence each other.

The above and other objects and features of the present invention will become apparent from the following detailed description and the appended claims with reference to the accompanying drawings.

DETAILED DESCRIPTION OF THE PREFERRED EMBODIMENTS

Figure 1:
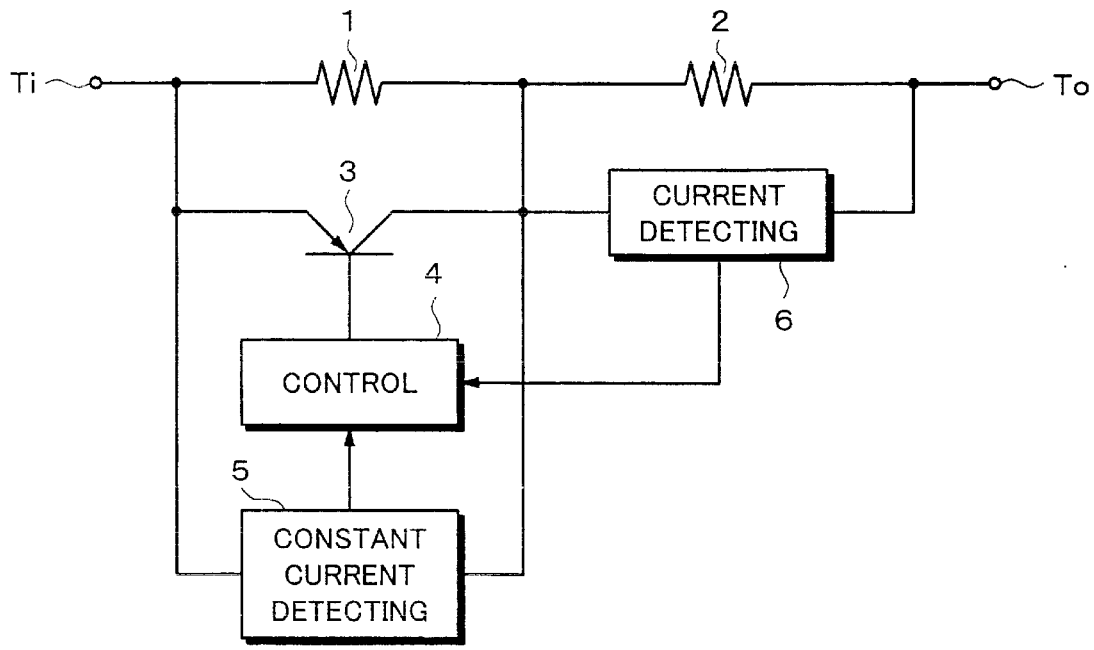
FIG. 1 is a block diagram of the first embodiment to which the invention is applied.

An embodiment of the invention will now be described hereinbelow with reference to the drawings. Component elements having substantially the same functions and signals having substantially the same effects in the diagrams are designated by the same reference numerals and their overlapped description is omitted. FIG. 1 shows the first embodiment to which the invention is applied. Rectified voltage and current are supplied from an input terminal Ti. Resistors 1 and 2 are serially connected between the input terminal Ti and an output terminal To. A load is connected to the output terminal To. In the example, when a resistance value R1 of the resistor 1 is compared with a resistance value R2 of the resistor 2, there is a relation of R1>R2.

The resistor 1 is provided between an emitter and a collector of a pnp-type transistor 3 and a constant current detecting circuit 5 also is provided therebetween. A base of the transistor 3 is connected to a control circuit 4 and controlled by the control circuit 4. The constant current detecting circuit 5 detects a current from a voltage across the resistor 1. A current detecting circuit 6 is connected to both ends of the resistor 2 and detects a current from a voltage across the resistor 2. The constant current detecting circuit 5 detects a small current and the current detecting circuit 6 detects a large current.

When a small current is detected by the constant current detecting circuit 5, a signal is supplied to the control circuit 4. The control circuit 4 supplies a signal for raising the impedance of the transistor 3 to the base of the transistor 3. Therefore, no current flows in the transistor 3. At this time, the impedance of the transistor 3 is controlled so as not to be equal to or larger than a current I1 flowing in the resistor 1Δ the resistance value R1 of the resistor 1.

That is, when the current of a predetermined value is detected by the constant current detecting circuit 5 and the transistor 3 is turned off, the constant current detecting circuit 5 cannot detect a subsequent current change. Therefore, as a signal to turn on the transistor 3, a signal according to the current detected by the current detecting circuit 6 is outputted.

Figure 2:
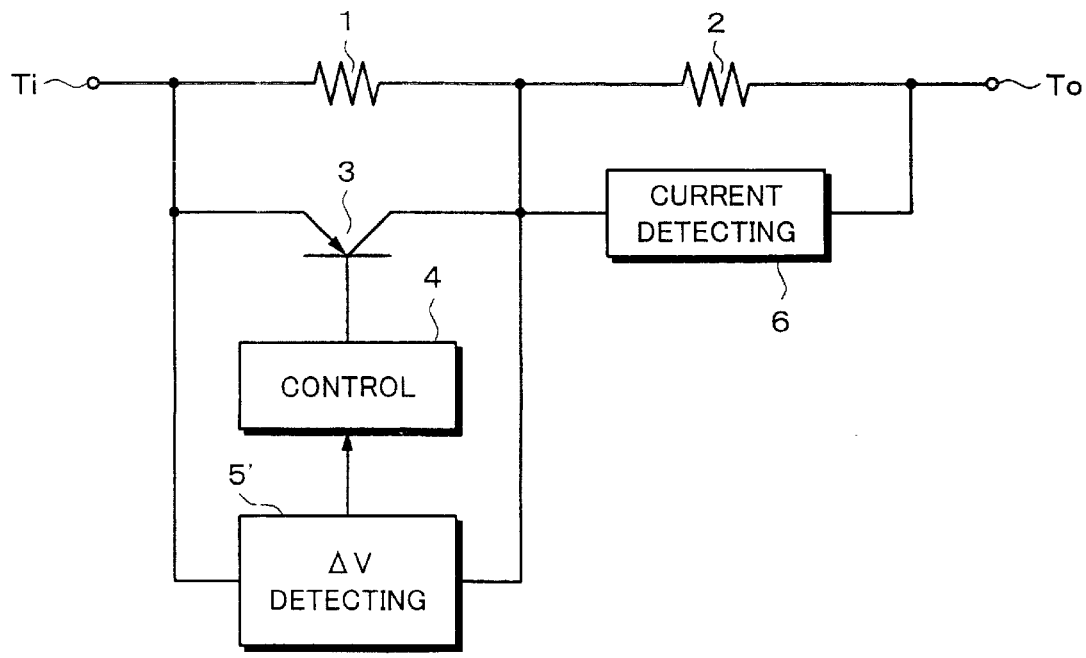
FIG. 2 is a block diagram of another example of the first embodiment to which the invention is applied.

FIG. 2 shows another example of the first embodiment. In another example shown in FIG. 2, a ΔV detecting circuit 5' is used in place of the constant current detecting circuit 5. The ΔV detecting circuit 5' detects a potential difference of the voltage across the resistor 1, that is, ΔV. When ΔV is detected, a signal is supplied to the control circuit 4. The control circuit 4 supplies the signal for raising the impedance of the transistor 3 to the base of the transistor 3. As mentioned above, even when ΔV is detected, an effect that is similar to that by the constant current detection can be obtained.

Figure 3:
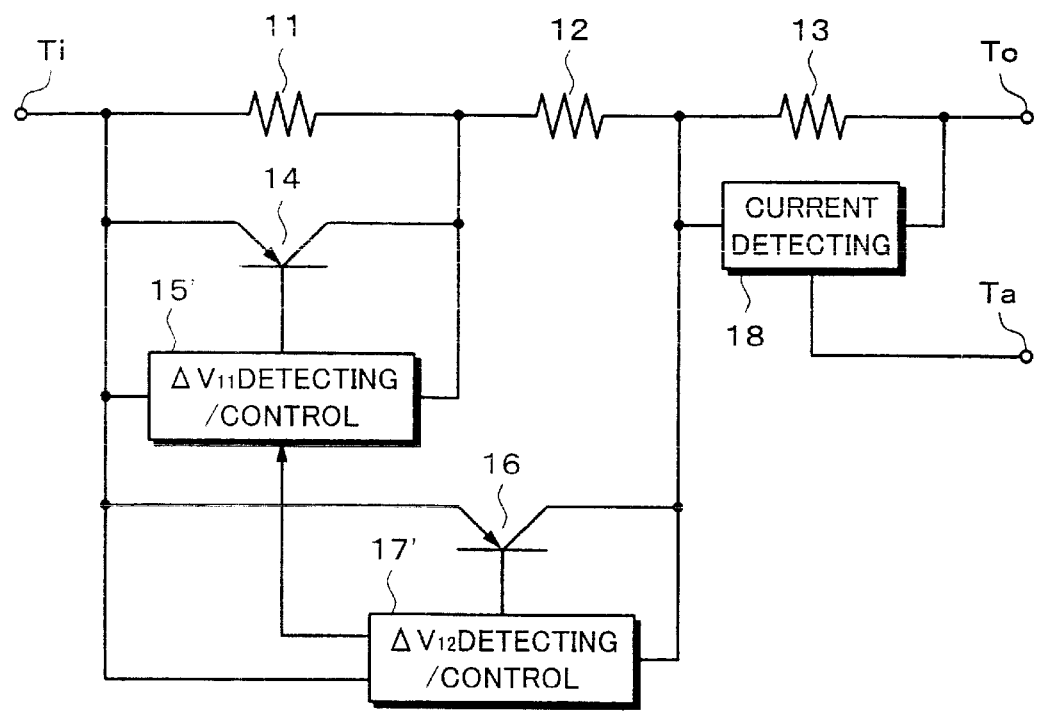
FIG. 3 is a block diagram of the second embodiment to which the invention is applied.

FIG. 3 shows the second embodiment of the invention. Resistors 11, 12, and 13 are serially inserted between the input terminal Ti and output terminal To. The resistor 11 is provided between an emitter and a collector of a pnp-type transistor 14 and a ΔV11 detecting/control circuit 15' is also provided therebetween. A base of the transistor 14 is connected to the ΔV11 detecting/control circuit 15' and controlled by the ΔV11 detecting/control circuit 15'. The ΔV11 detecting/control circuit 15' detects a current from a voltage across the resistor 11. When a predetermined potential difference (ΔV11) is detected by the ΔV11 detecting/control circuit 15', a signal for raising the impedance of the transistor 14 is supplied to the base of the transistor 14.

The resistors 11 and 12 are serially provided between an emitter and a collector of a pnp-type transistor 16, and a ΔV12 detecting/control circuit 17' also is provided therebetween. A base of the transistor 16 is connected to the ΔV12 detecting/control circuit 17'. The transistor 16 is controlled by the ΔV12 detecting/control circuit 17'. The ΔV12 detecting/control circuit 17' detects a current from a voltage across the resistors 11 and 12 provided serially. When a predetermined potential difference (ΔV12) is detected by the ΔV12 detecting/control circuit 17', a signal for raising the impedance of the transistor 16 is supplied to the base of the transistor 16. Further, a signal for reducing the impedance of the transistor 14 is supplied from the ΔV12 detecting/control circuit 17' to the ΔV11 detecting/control circuit 15'.

A current detecting circuit 18 is connected to both ends of the resistor 13 and a current is detected from a voltage across the resistor 13. The current detecting circuit 18 transmits a signal according to the detected current to, for example, a microcomputer through a terminal Ta.

When ΔV11 is detected as a potential difference of the voltage across the resistor 11 by the ΔV11 detecting/control circuit 15', as mentioned above, a current which is equal to or larger than a maximum current I11 flowing in the resistor 11 does not flow. When ΔV12 is detected as a potential difference of the voltage across the resistors 11 and 12 by the ΔV12 detecting/control circuit 17', a current which is equal to or larger than a maximum current I12 flowing in the resistor 12 does not flow. Actually, since the impedance of the transistor 14 is lowered, ΔV12 is derived from a potential difference of the voltage across the resistor 12.

Although the ΔV11 detecting/control circuit 15' has been used in the second embodiment, a constant current detecting/control circuit, a ΔV11 detecting circuit and a control circuit, or a constant current detecting circuit and a control circuit also can be used. Although the ΔV12 detecting/control circuit 17' has been used, a constant current detecting circuit and a control circuit, a ΔV12 detecting circuit and a control circuit, or a constant current detecting circuit and a control circuit also can be used.

Figure 4:
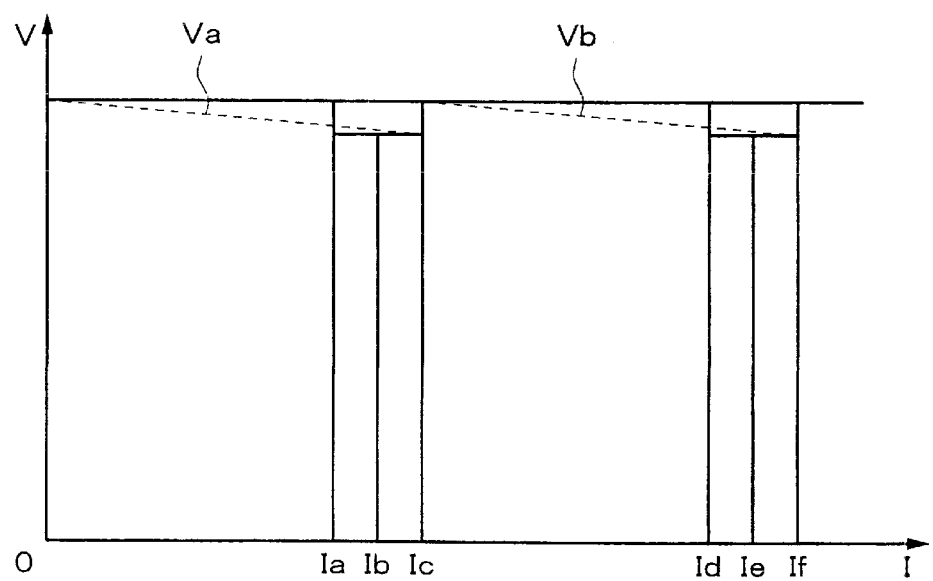
FIG. 4 shows an example of a voltage/current characteristics diagram for explaining the invention.

A voltage drop of the resistor 11 is set to be lower than ΔV11. A voltage drop of the resistor 12 is set to be lower than ΔV12. Broken lines shown in FIG. 4 indicate a voltage drop Va due to the resistor 11 and a voltage drop Vb due to the resistor 12. As for the voltage drop Va, the resistor 11 is selected so as to obtain a voltage value higher than ΔV11 until a current Ib. When the current is a current after the current Ib, for example, a current Ic, the transistor 14 is turned on. That is, the current at which the transistor 14 is turned on is selected so as to obtain a current value larger than the current Ib. As for the voltage drop Vb, the resistor 12 is selected so as to obtain a voltage value higher than ΔV12 until a current Ie. When the current is a current after the current Ie, for example, a current If, the transistor 16 is turned on. That is, the current at which the transistor 16 is turned on is selected so as to obtain a current value larger than the current Ie.

It also is possible to turn on the transistor 14 by detecting ΔV11 from the resistor 11 and to turn on the transistor 16 by detecting ΔV12 from the resistor 12. In this case, the transistor 14 is turned on by a current smaller than the current Ib and the transistor 16 is turned on by a current smaller than the current Ie.

Further, also in the case where the apparatus has a constant current detecting circuit, similarly, in order to reduce the loss of the transistor, when a predetermined current is detected, the transistor is turned on or off. When transistor 14 is turned on, the current cannot be detected from the voltage across the resistor 11. However, since the maximum current I12 that can be detected from the resistor 12 satisfies a relation of I12>I11, the current I11 is extracted from the current I12 in the embodiment. Therefore, the transistor 14 is turned on or off by the extracted current I11. Similarly, the current I11 is extracted from the maximum current I13 that can be detected from the resistor 13 and the on/off operations of the transistor 16 is controlled by the extracted current I12.

Figure 5:
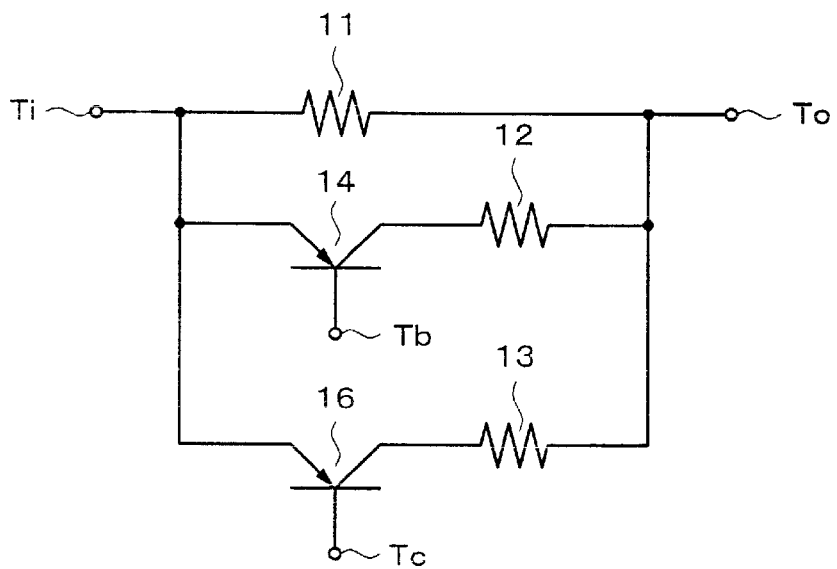
FIG. 5 is a block diagram of the third embodiment to which the invention is applied.

The third embodiment of the invention will be described with reference to FIG. 5. In the third embodiment, the resistors 11, 12, and 13 are provided in parallel between the input terminal Ti and output terminal To, the transistor 14 is provided between the resistor 12 and input terminal Ti, and the transistor 16 is provided between the resistor 13 and input terminal Ti. Although not shown, a terminal Tb led out from the base of the transistor 14 is connected to the control circuit, and a terminal Tc led out from the base of the transistor 16 is connected to the control circuit. At this time, it is assumed that there is a relation of R11>R12>R13 among a resistance value R11 of the resistor 11, a resistance value R12 of the resistor 12, and a resistance value R13 of the resistor 13.

Figure 6:
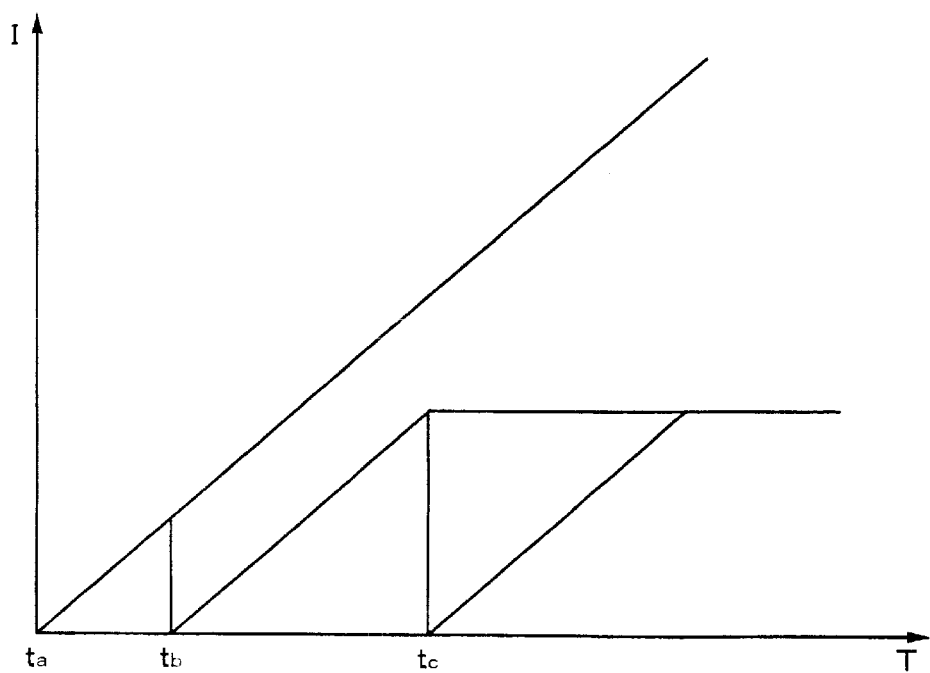
FIG. 6 shows an example of a characteristics diagram for explaining the invention.

A constant current is detected from the voltage across the resistor 11 for a period of time from a time point ta to a time point tb shown in FIG. 6. As mentioned above, since the transistor 14 operates by $\Delta V$, it is turned on after the time point tb. Similarly, since the transistor 16 also operates by $\Delta V$, as mentioned above, it is turned on after a time point tc. In this instance, the transistor 14 is turned off. Even if the transistor 14 is turned off, a large current can be detected in the resistor 13. Since R11>>R13, an accurate current can be detected from the voltage across the resistor 13.

Figure 7:
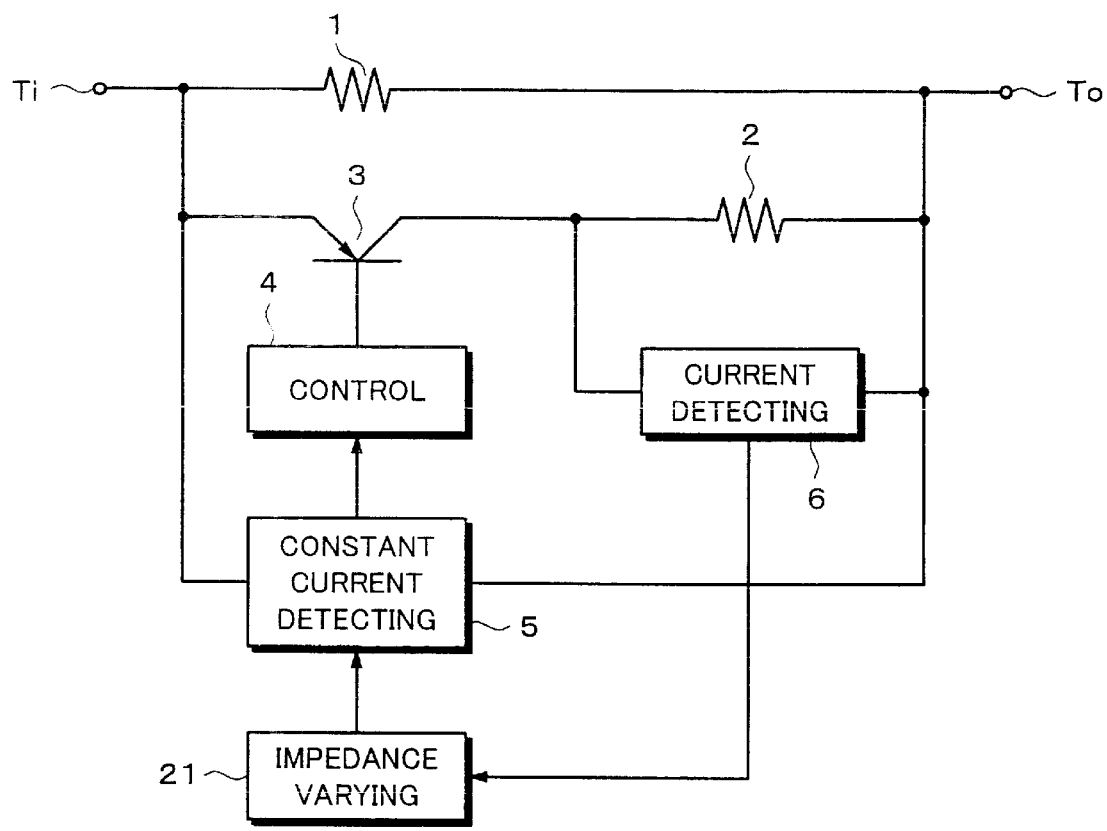
FIG. 7 is a block diagram of the first example to which the invention is applied.

FIG. 7 shows a block diagram of the first example to which the invention is applied. As shown in FIG. 7, the transistor 3 can also be controlled by a value of the current flowing in the resistor 2. In the example shown in FIG. 7, the current flowing in the resistor 2 is detected from the voltage across the resistor 2 by the current detecting circuit 6. When the detected current is equal to a predetermined value, a signal is supplied from the current detecting circuit 6 to an impedance varying circuit 21. The impedance varying circuit 21 supplies a signal for reducing the impedance of the transistor 3 from the control circuit 4 to the base of the transistor 3 through the constant current detecting circuit 5 in order to reduce the impedance of the transistor 3.

Figure 8A:
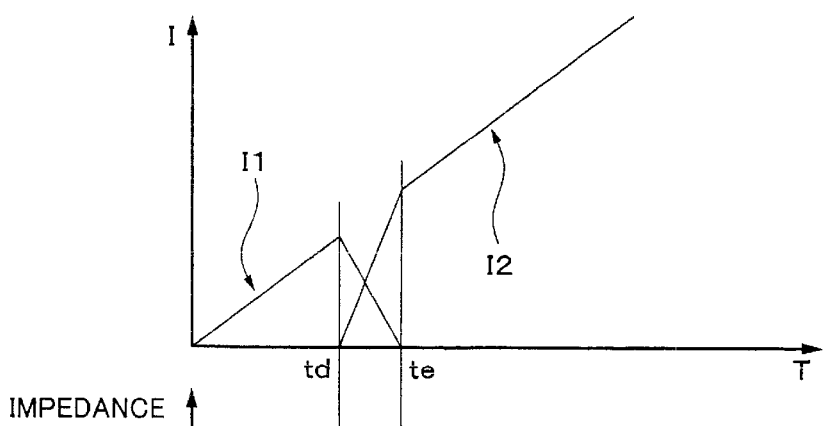
FIGS. 8A and 8B show examples of characteristics diagrams for explaining the invention.
Figure 8B:
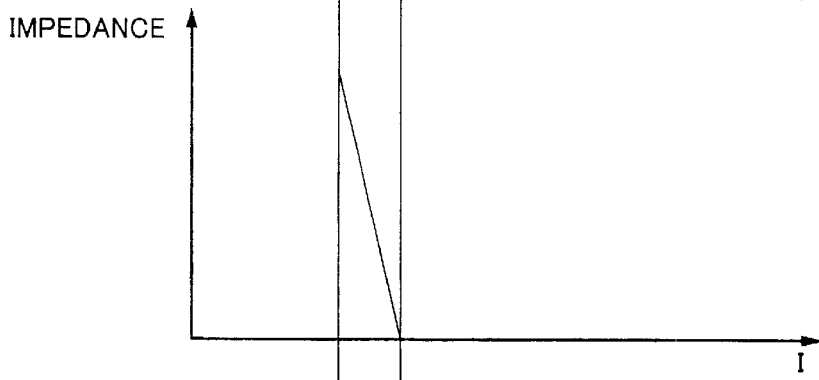

As shown in FIG. 8A, the current I1 flowing in the resistor 1 starts to decrease at a time point td and a current I2 flowing in the resistor 2 starts to rise. At a time point te, the current I1 reaches almost zero and, as for the current I2, the supplied current can be detected. At the time point td, as shown in FIG. 8B, the impedance of the transistor 3 starts to decrease. At the time point te, the impedance of the transistor 3 reaches almost zero. By this method, the detection loss can be reduced.

Figure 9:
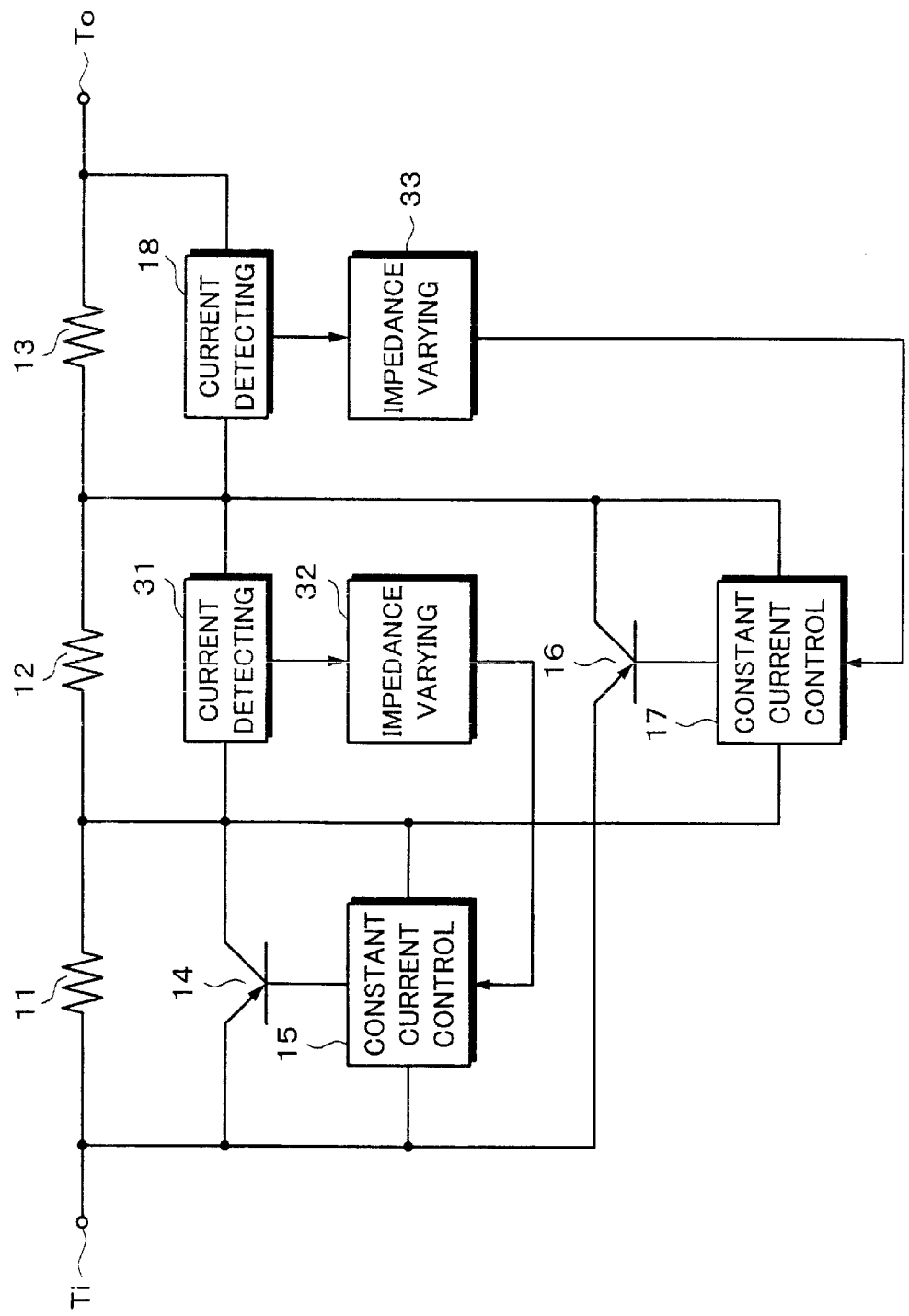
FIG. 9 is a block diagram of the second example to which the invention is applied.

FIG. 9 shows a block diagram of the second example to which the invention is applied. As shown in FIG. 9, also in the case of using the three resistors 11, 12, and 13, similarly, the current flowing in the resistor 12 is detected by a current detecting circuit 31, and when the detected current is equal to a predetermined value, a signal is supplied to an impedance varying circuit 32. The impedance varying circuit 32 supplies a signal to the base of the transistor 14 through a constant current control circuit 15 in order to reduce the impedance of the transistor 14.

The current detecting circuit 18 detects the current flowing in the resistor 13. When the detected current is equal to a predetermined value, a signal is supplied to an impedance varying circuit 33. The impedance varying circuit 33 supplies a signal to the base of the transistor 16 through a constant current control circuit 17 in order to reduce the impedance of the transistor 16.

Also in the block diagram shown in FIG. 9, in a manner similar to the circuit of the block diagram shown in FIG. 7 mentioned above, when the current flowing in the resistor 12 is equal to a predetermined value, the impedance of the transistor 14 starts to decrease. Further, when the current flowing in the resistor 13 is equal to a predetermined value, a control is made so as to start to decrease the impedance of the transistor 16.

Figure 10:
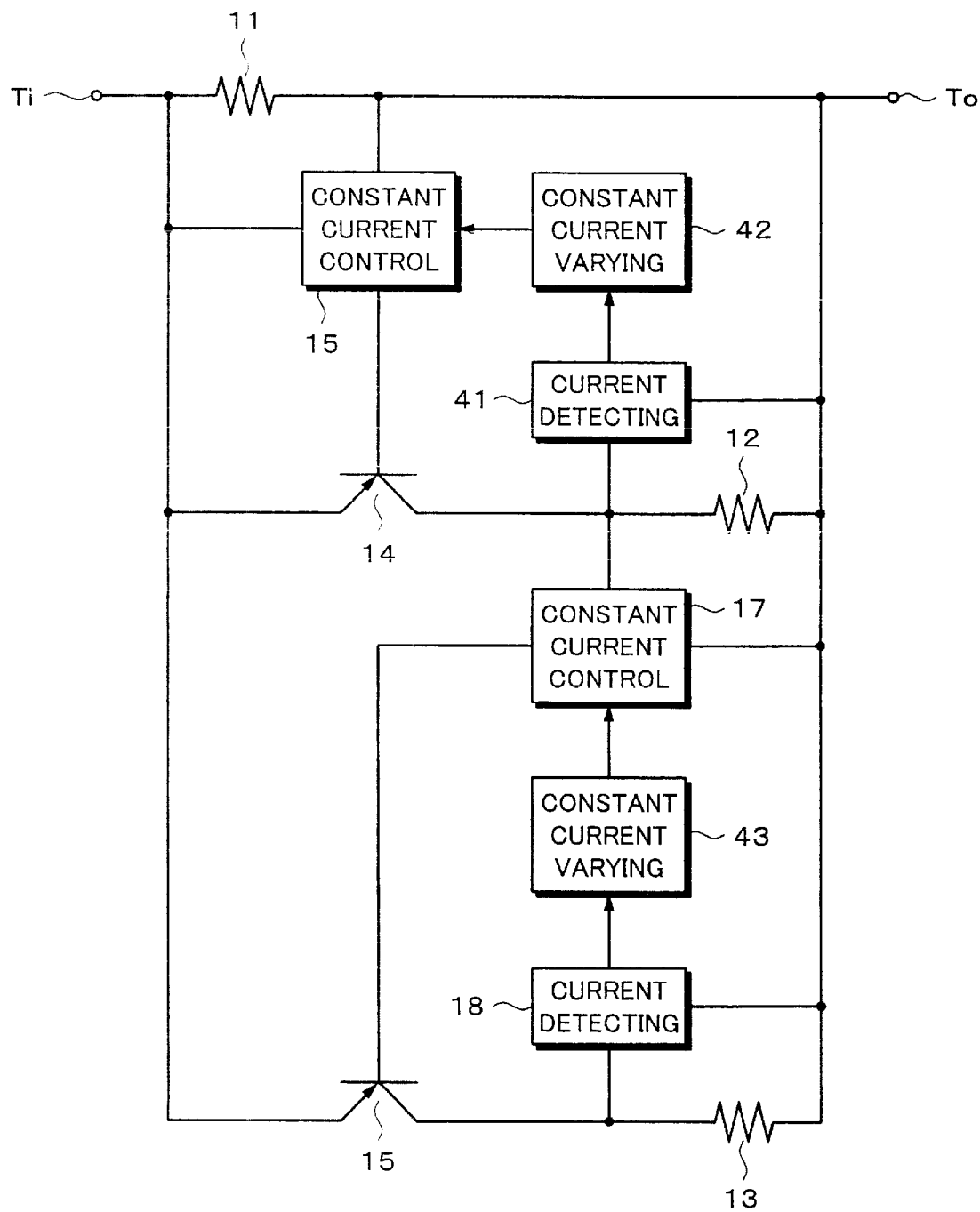
FIG. 10 is a block diagram of the third example to which the invention is applied.

FIG. 10 shows a block diagram of the third example to which the invention is applied. A current detecting circuit 41 detects the current flowing in the resistor 12. When the detected current reaches a predetermined value, a signal is supplied to the constant current control circuit 15 through a constant current varying circuit 42 so as to reduce a detected constant current in order to decrease the current flowing in the resistor 11. The current detecting circuit 18 detects the current flowing in the resistor 13. When the detected current reaches a predetermined value, a signal is supplied to the constant current control circuit 17 through a constant current varying circuit 43 so as to reduce a detected constant current in order to decrease the current flowing in the resistor 12.

Figure 11:
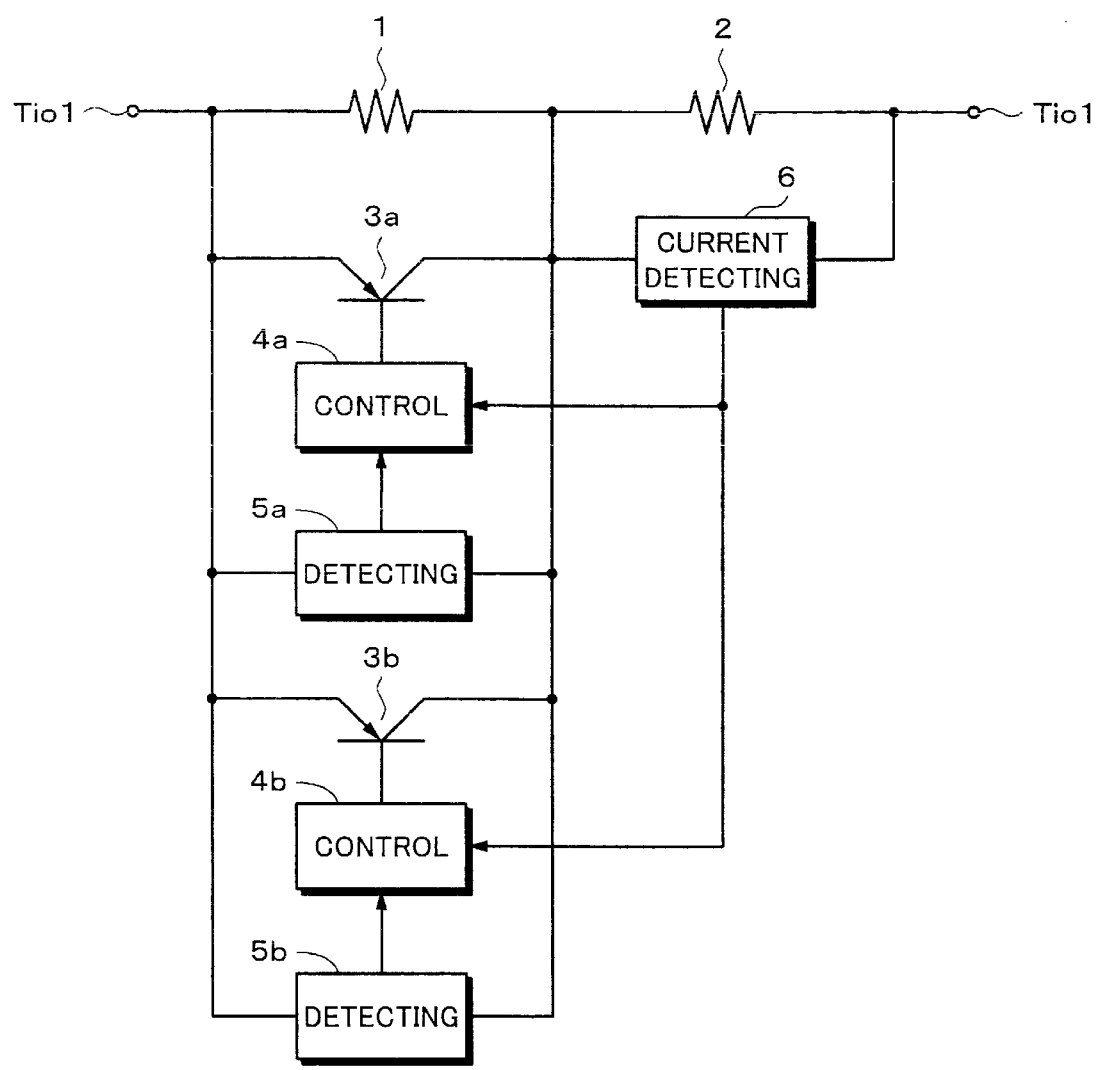
FIG. 11 is a block diagram of the fourth embodiment to which the invention is applied.

FIG. 11 shows the fourth embodiment of the invention. The fourth embodiment also can be used in the case where the voltages and currents are supplied from both directions. A voltage and a current are supplied from a terminal Tio1 or Tio2. When the voltage and current are supplied from the terminal Tio1, the current flowing in the resistor 1 is detected by a transistor 3a, a control circuit 4a, and a detecting circuit 5a. When the voltage and current are supplied from the terminal Tio2, the current flowing in the resistor 1 is detected by a transistor 3b, a control circuit 4b, and a detecting circuit 5b. The current flowing in the resistor 2 is detected by the current detecting circuit 6. The on/off operations of the transistor 3a or 3b are controlled in accordance with the detected current.

Although the transistors 3a and 3b are used in the fourth embodiment, an FET also can be used in place of each of the transistors. In this case, since there is a voltage drop of about 0.6V due to a parasitic diode in the FET, $\Delta V$ is set in consideration of the voltage drop of about 0.6V.

Although the detecting circuits 5a and 5b are used in the fourth embodiment, as mentioned above, the constant current detecting circuit can be used in place of each of them or the $\Delta V$ detecting circuit also can be used.

Figure 12:
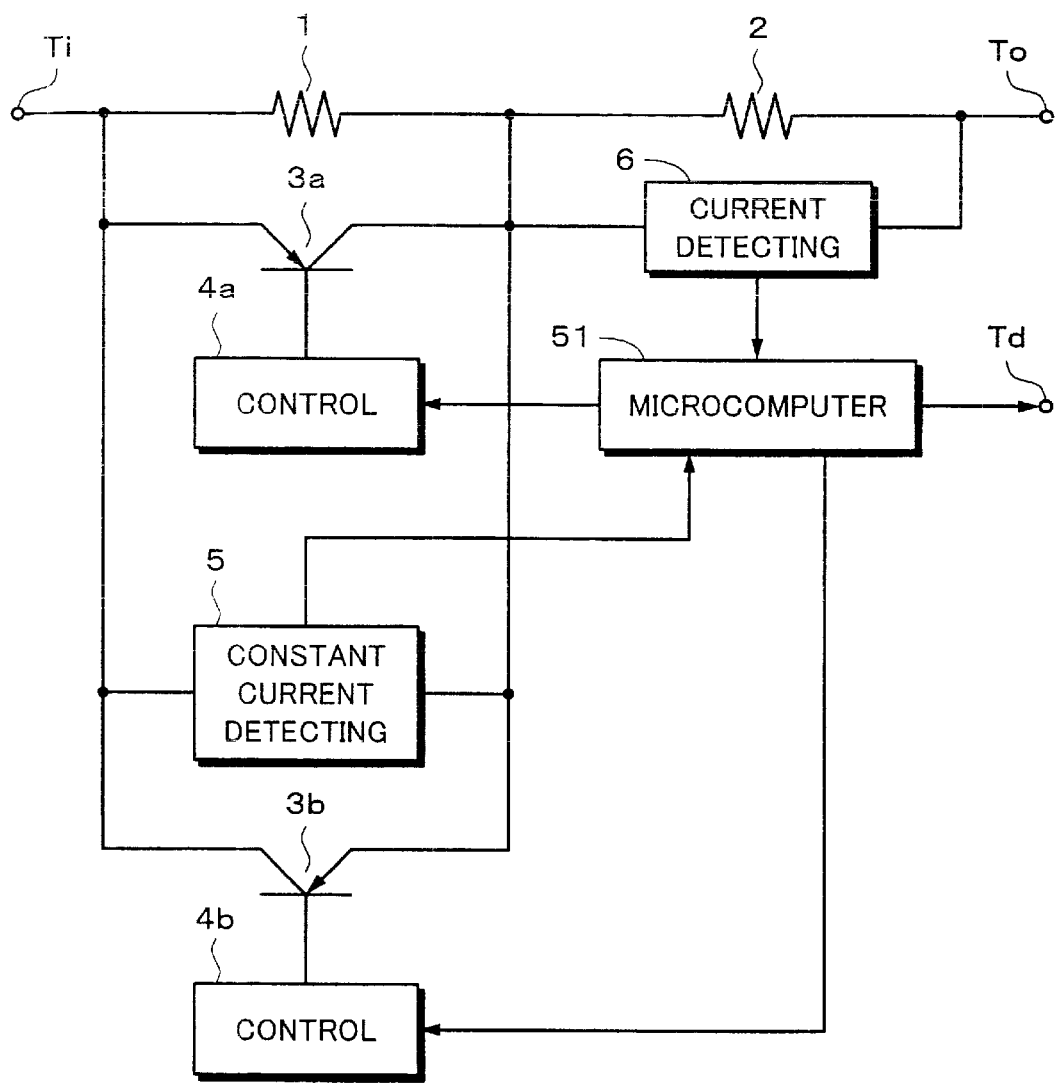
FIG. 12 is a block diagram of another example of the fourth embodiment to which the invention is applied.

FIG. 12 shows another example of the fourth embodiment. In a microcomputer 51, when the current of the predetermined value is detected by each of the constant current detecting circuits 5 and 6, a signal is supplied from the constant current detecting circuit 5. The microcomputer 51 controls the transistors 3a and 3b through control circuits 4a and 4b in accordance with the supplied signal.

As mentioned above, by using the microcomputer, the control of the transistors 3a and 3b can be set to various control methods on the basis of the current that is obtained from the voltage across the resistor 1 and/or the current that is obtained from the voltage across the resistor 2.

Figure 13:
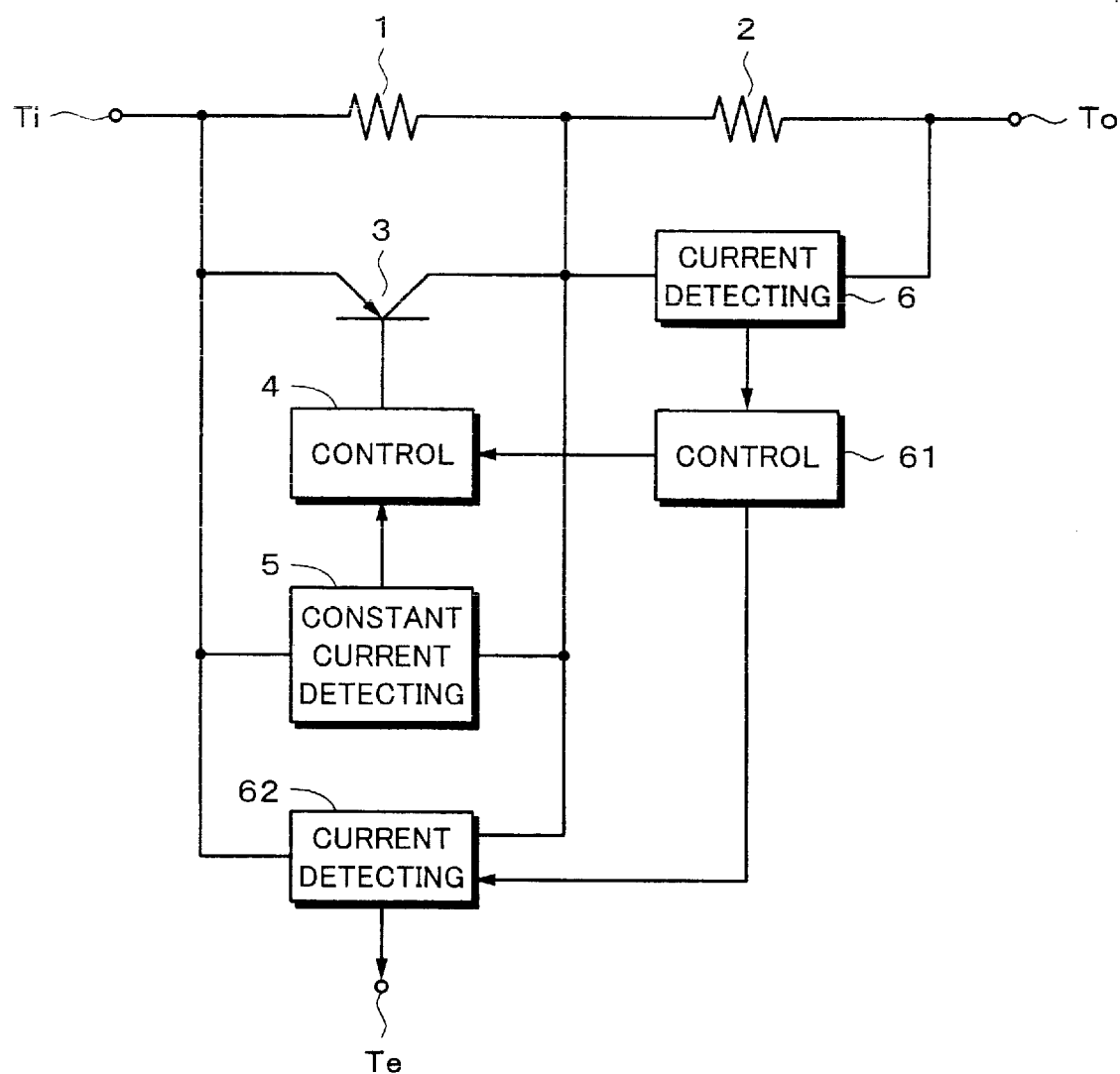
FIG. 13 is a block diagram of the fifth embodiment to which the invention is applied.

FIG. 13 shows the fifth embodiment of the invention. In the current detecting circuit 6, when the detected current is equal to a predetermined value, a signal is supplied to a control circuit 61. The control circuit 61 controls the on/off operations of the transistor 3 through the control circuit 4 in response to the supplied signal. Similarly, the control circuit 61 changes the predetermined value of the current which flows in the resistor 1 and is detected by a current detecting circuit 62, or the control circuit 61 stops the detecting operation of the current detecting circuit 62 in accordance with the supplied signal. The current flowing in the resistor 1 is detected by the current detecting circuit 62. When the detected current is equal to the predetermined value, the signal is outputted from a terminal Te.

Figure 14:
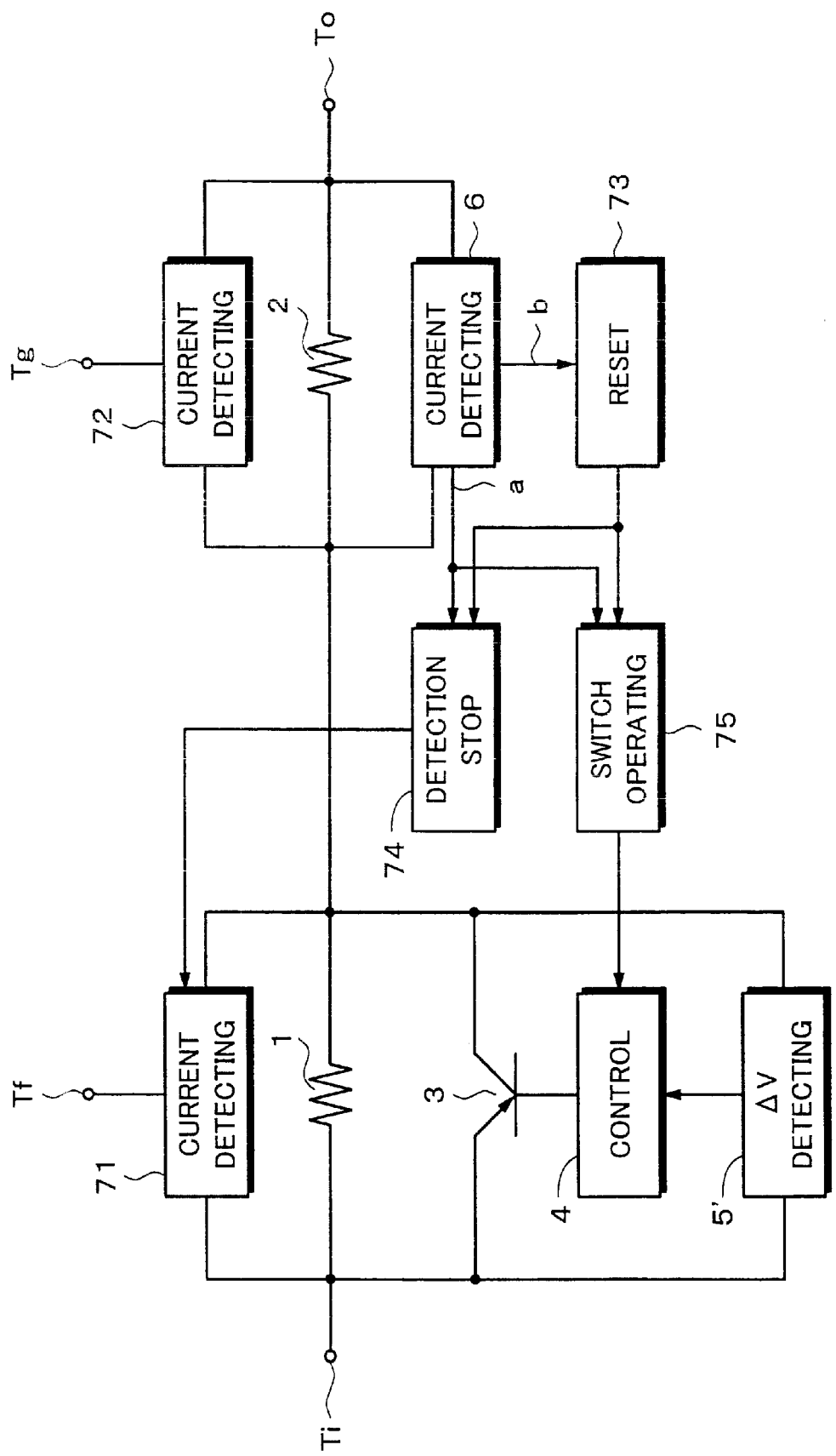
FIG. 14 is a block diagram of the first example of the sixth embodiment to which the invention is applied.

FIG. 14 shows the first example of the sixth embodiment of the invention. A current is detected by a current detecting circuit 71. When the detected current is equal to a predetermined value, a signal is outputted from a terminal Tf. A current is detected by a current detecting circuit 72. When the detected current is equal to a predetermined value, a signal is outputted from a terminal Tg. The current detecting circuit 6 detects the current flowing in the resistor 2. When the detected current is equal to or less than a first current value, a signal (b) is supplied from the current detecting circuit 6 to a reset circuit 73. When the detected current is equal to or less than a second current value larger than the first current value, a signal (a) is supplied from the current detecting circuit 6 to a detection stop circuit 74 and a switch operating circuit 75.

The reset circuit 73 supplies a reset signal to the detection stop circuit 74 and switch operating circuit 75. When the signal (a) is supplied, the detection stop circuit 74 stops the detecting operation of the current detecting circuit 71. When the signal is supplied from the reset circuit 73, the detection stop circuit 74 allows the current detecting circuit 71 to execute the detecting operation. When the signal is supplied, the switch operating circuit 75 supplies a signal to the control circuit 4 so as to turn on the transistor 3. When the signal is supplied from the reset circuit 73, the switch operating circuit 75 supplies a signal to the control circuit 4 so as to turn off the transistor 3.

Figure 15:
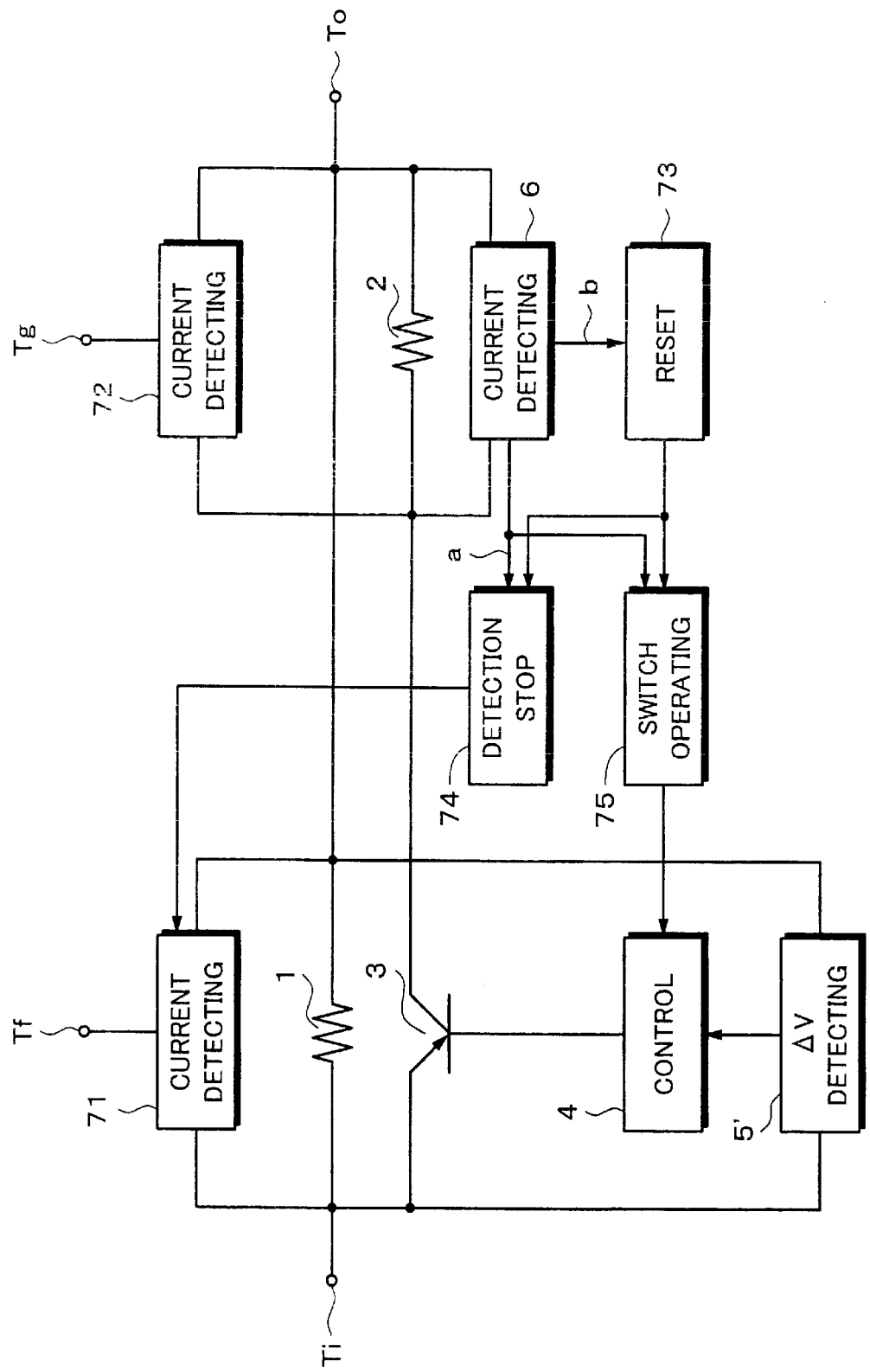
FIG. 15 is a block diagram of the second example of the sixth embodiment to which the invention is applied.

FIG. 15 shows the second example of the sixth embodiment of the invention. As shown in FIG. 15, the resistors 1 and 2 also can be arranged in parallel.

Although the ΔV detecting circuit 5' shown in FIG. 15 detects ΔV from both ends of the resistor 1, since there is the relation of R1>R2 between the resistors 1 and 2, ΔV also can be detected from both ends of the emitter and collector of the transistor 3.

Figure 16:
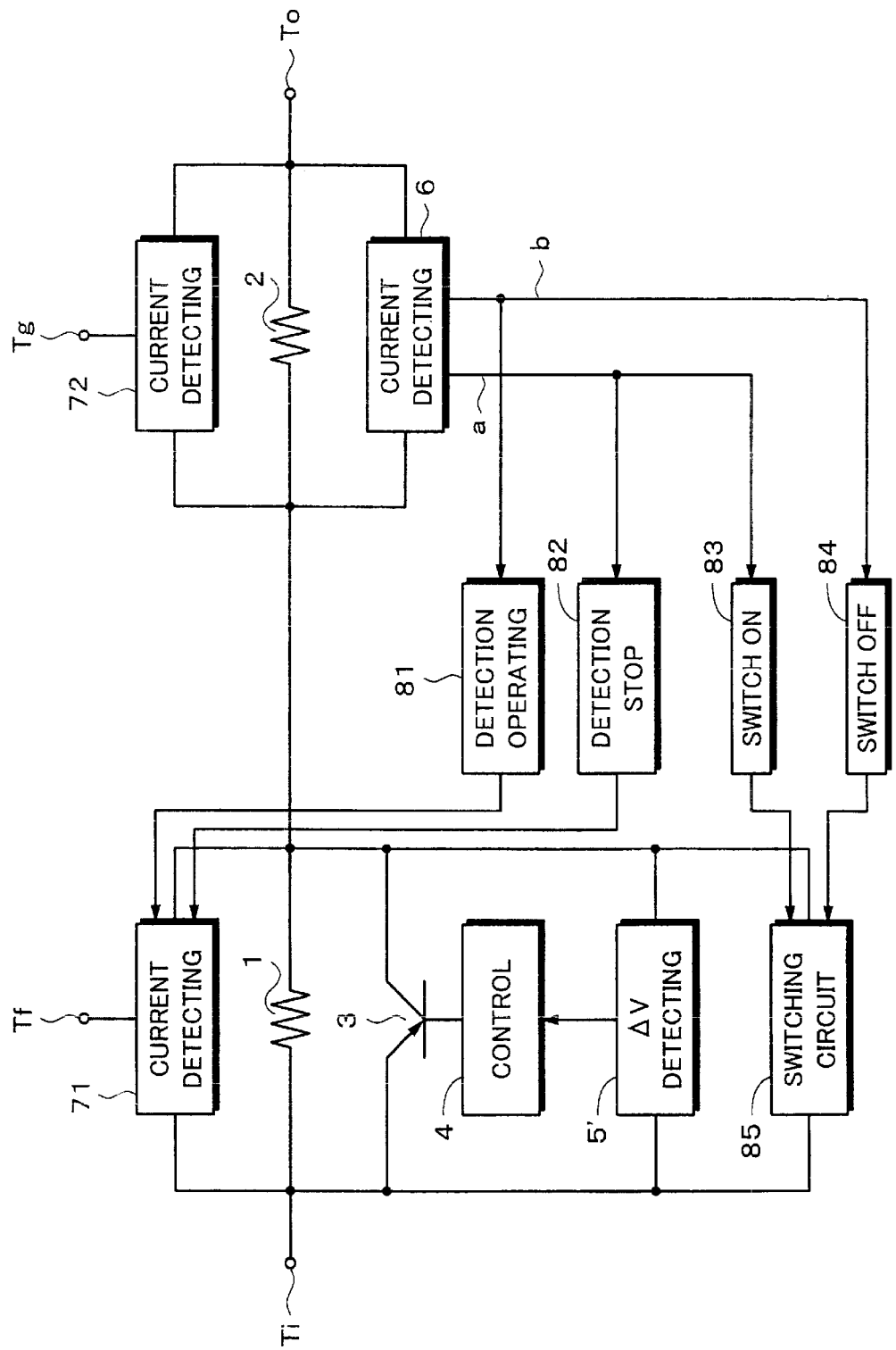
FIG. 16 is a block diagram of the third example of the sixth embodiment to which the invention is applied.

FIG. 16 shows the third example of the sixth embodiment of the invention. In the third example, a switching circuit is further provided for the control of ΔV. The current detecting circuit 6 detects the current flowing in the resistor 2. When the detected current is equal to or less than the first current value, the signal (b) is supplied from the current detecting circuit 6 to a detection operating circuit 81 and a switch OFF circuit 84. When the detected current is equal to or larger than a second current value larger than the first current value, the signal (a) is supplied from the current detecting circuit 6 to a detection stop circuit 82 and a switch ON circuit 83.

When the signal is supplied from the detection operating circuit 81, the current detecting circuit 71 detects the current flowing in the resistor 1. When the signal is supplied from the detection stop circuit 82, the current detecting circuit 71 stops the operation for detecting the current. When the signal is supplied from the switch ON circuit 83, a switching circuit 85 is turned on. When the signal is supplied from the switch OFF circuit 84, a switching circuit 85 is turned off.

The operation in the sixth embodiment will now be described with reference to a flowchart shown in FIG. 17. In step S1, the current is detected by the current detecting circuit 6. In step S2, whether or not the detected current is equal to or larger than the second current value is discriminated. When it is decided that it is equal to or larger than the second current value, the processing routine is advanced to step S3. When it is determined that it is less than the second current value, the processing routine is returned to step S1. In step S3, a delay of a time constant Δt is made. In step S4, the detecting operation of the current detecting circuit 71 is stopped. In step S5, the delay of the time constant Δt is made. In step S6, the signal to turn on the transistor 3 is supplied to the control circuit 4.

In step S7, the current is detected by the current detecting circuit 6. In step S8, whether or not the detected current is equal to or less than the first current value is discriminated. When it is decided that it is equal to or less than the first current value, the processing routine is advanced to step S9. When it is determined that it is larger than the first current value, the processing routine is returned to step S7. In step S9, the delay of the time constant Δt is made. In step S10, the signal to turn off the transistor 3 is supplied to the control circuit 4. In step S11, the delay of the time constant Δt is made. In step S12, the detecting operation of the current detecting circuit 71 is executed. The processing routine is returned to step S1.

Figure 17:
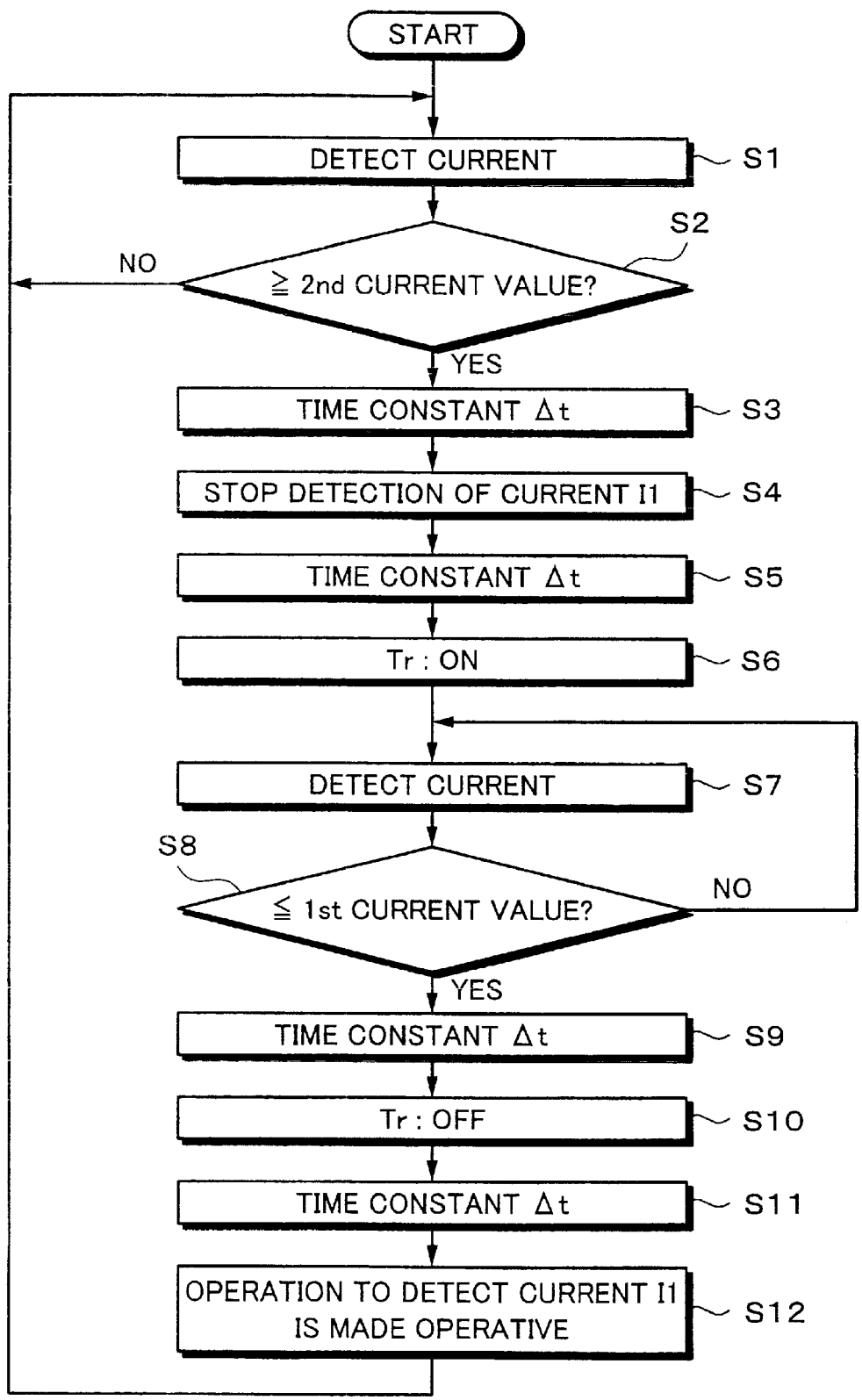
FIG. 17 is a flowchart for explaining the operation in the sixth embodiment to which the invention is applied.

In the flowchart shown in FIG. 17, the time constant Δt in steps S3, S5, S9, and S11 is not the delay that is always necessary. Such a control can be omitted depending on its setting method.

Figure 18:
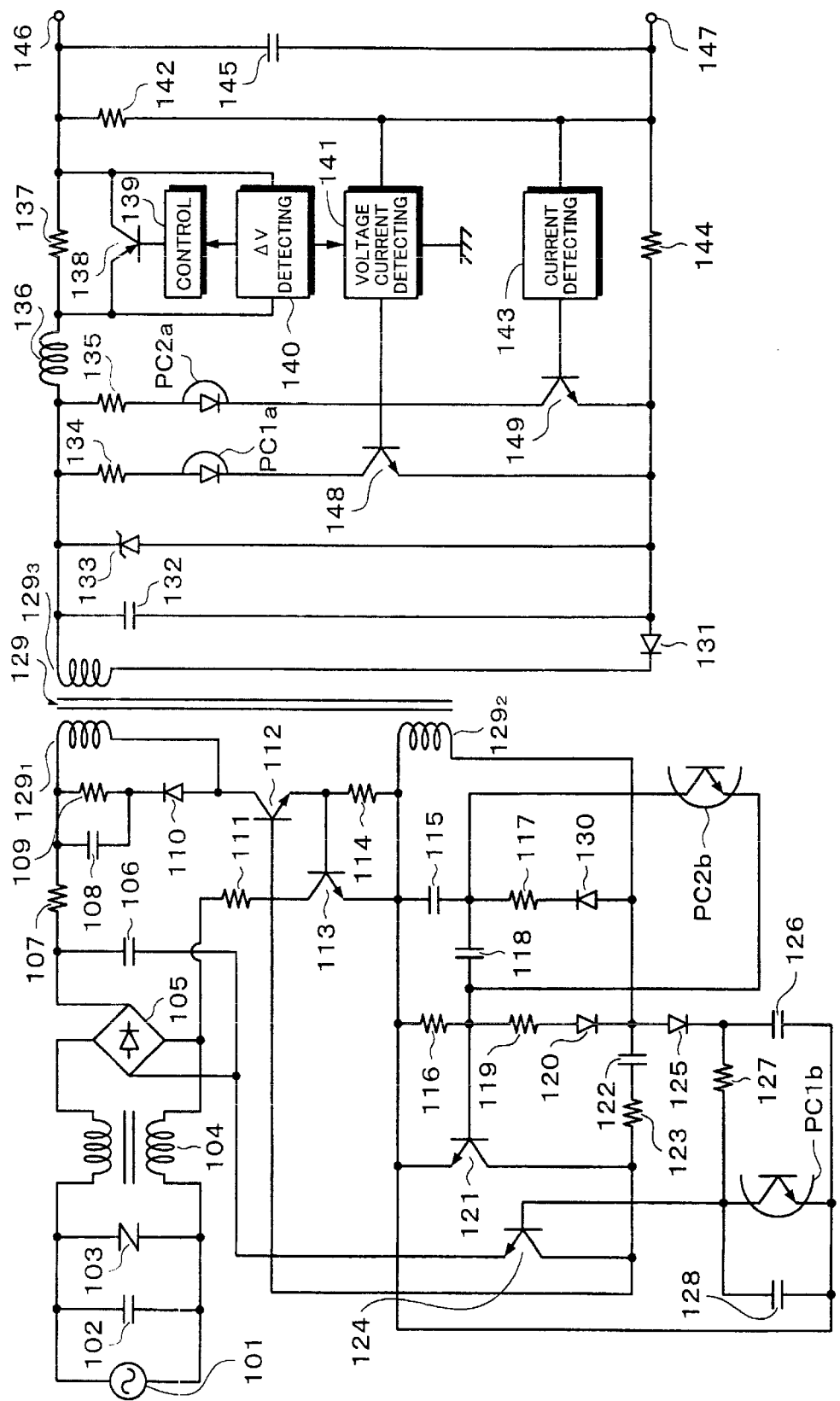
FIG. 18 is a block diagram to which the invention is applied.
Figure 19:
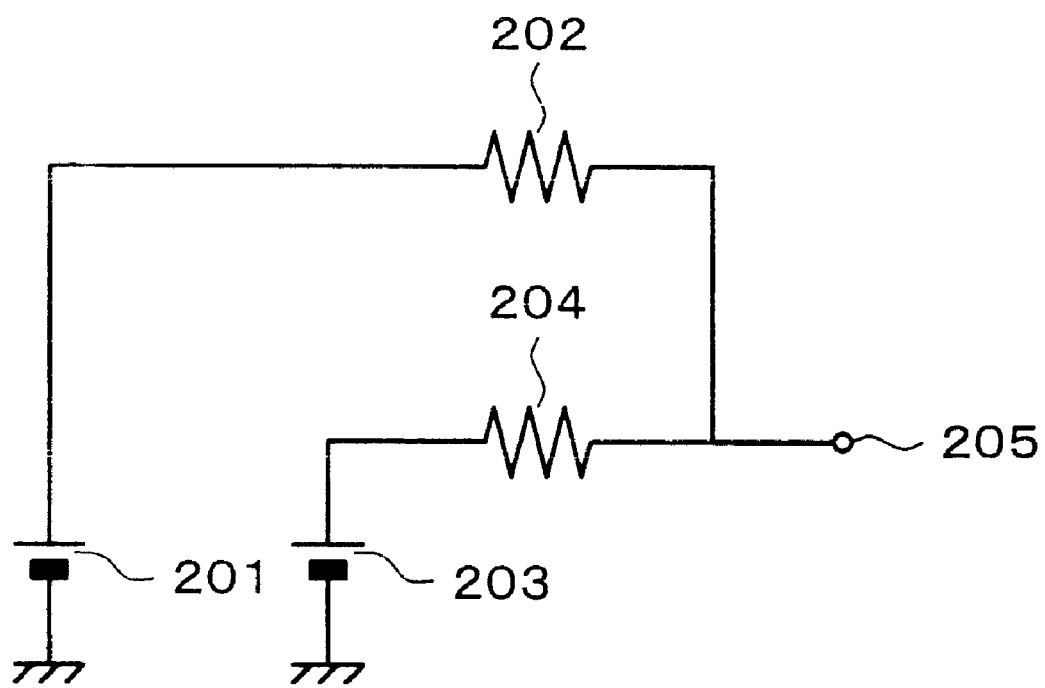
FIG. 19 is a block diagram of an example of conventional current detection.

FIG. 18 shows an embodiment of a circuit diagram of an AC adapter to which the invention is applied. A commercially available power source that is supplied from a commercially available power source 101 passes through a rectifying circuit comprising a capacitor 102, a noise remover 103, a filter 104, a diode bridge 105, and a capacitor 106. A resistor 107, a capacitor 108, a resistor 109, a diode 110, a pnp-type transistor 112, and a resistor 111 are provided between the rectifying circuit and a primary winding $129_1$ of a transformer 129. The transistor 112, a transistor 113, and a resistor 114 are provided between the primary winding $129_1$ and a secondary winding $129_2$.

A receiving unit for receiving a signal that is transmitted from the secondary side of the transformer 129 is provided for the secondary winding $129_2$. A first receiving unit comprises: a receiving unit which is formed by a photodiode PC1b of a photocoupler and an npn-type transistor 124; and a power supplying unit which is formed by a resistor 116, a resistor 119, a diode 120, a diode 125, a capacitor 126, a resistor 127, and a capacitor 128. The first receiving unit receives a signal showing that a load has been connected on the secondary side. A second receiving unit comprises: a receiving unit which is formed by a photodiode PC2b of a photocoupler and an npn-type transistor 121; and a power supplying unit which is formed by a capacitor 115, a resistor 117, a diode 130, and a capacitor 118. The second receiving unit receives a signal showing that a constant voltage and a constant current have been detected on the secondary side. A capacitor 122 and a resistor 123 are provided between the receiving units of the first and second receiving units and the power supplying unit.

A rectifying circuit comprising a diode 131 and a capacitor 132 is provided for a ternary winding 1293 serving as a secondary side of the transformer. A Zener diode 133 is provided in parallel with the rectifying circuit. A first transmitting unit which is formed by a resistor 134, a light emitting diode PC1a of a photocoupler, and an npn-type transistor 148 is provided in parallel with the rectifying circuit. A second transmitting unit which is formed by a resistor 135, a light emitting diode PC2a of a photocoupler, and an npn-type transistor 149 is also provided in parallel with the rectifying circuit.

An inductor 136 and a resistor 137 are serially provided between the rectifying circuit and an output terminal 146. A resistor 144 is provided between the rectifying circuit and an output terminal 147. The resistor 137 is used to detect the small current. A ΔV detecting circuit 140 detects ΔV from a voltage across the resistor 137. When a predetermined value is detected by the ΔV detecting circuit 140, a pnp-type transistor 138 is turned on through a control circuit 139. Similarly, when a predetermined value is detected by the ΔV detecting circuit 140, a signal is supplied to a voltage current detecting circuit 141.

A resistor 142 and a capacitor 145 are provided in parallel between the output terminals 146 and 147. The voltage current detecting circuit 141 detects a voltage and/or a current from a node of the resistor 142 and output terminal 147. In the voltage current detecting circuit 141, the npn-type transistor 148 is controlled on the basis of the detected voltage and/or current and the signal obtained from the ΔV detecting circuit 140. When the transistor 148 is turned on, the light emitting diode PC1a is turned on, and a signal showing that a load has been connected is transmitted to the primary side. A current detecting circuit 143 detects a current from a voltage across the resistor 144. When the detected voltage is equal to a predetermined value, the transistor 149 is turned on. When the transistor 149 is turned on, the light emitting diode PC2a is turned on, and a signal showing that a constant current and a constant voltage have been detected is transmitted to the primary side.

According to the invention, a detecting range of the current can be enlarged. Since it is possible to construct the apparatus so that it is not influenced by the different detecting circuits, the loss can be reduced and, further, detection errors can be decreased. The present invention is not limited to the foregoing embodiments but many modifications and variations are possible within the spirit and scope of the appended claims of the invention.

What is claimed is:

1. A current detecting apparatus comprising:
   a first resistor provided between an input terminal and an output terminal;
   first switching means provided in parallel with said first resistor;
   control means for controlling said switching means;
   first detecting means for detecting a current flowing in said first resistor or a potential difference which is caused in said first resistor;
   a second resistor provided so as to be serial to at least said first switching means; and
   second detecting means for detecting a current flowing in said second resistor or a potential difference which is caused in said second resistor,
   wherein said control means
      turns off said switching means when the current or potential difference that is equal to or larger than a first predetermined value is detected by said first detecting means and
      turns on said switching means when the current or potential difference that is equal to or smaller than a second predetermined value is detected by said second detecting means, and
      said first and second detecting means output the detected current or potential difference.

2. An apparatus according to claim 1, further comprising impedance varying means which can vary an impedance of said first switching means.

3. An apparatus according to claim 1, further comprising varying means which can vary said first predetermined value of said first detecting means.

4. An apparatus according to claim 1, further comprising:
   second switching means provided in parallel with said second resistor;
   a third resistor which is provided so as to be serial to at least said second switching means and has a value smaller than that of said second resistor; and
   third detecting means for detecting a current or a small voltage from said third resistor.

5. An apparatus according to claim 4, further comprising impedance varying means which can vary an impedance of said second switching means.

6. An apparatus according to claim 4, further comprising varying means which can vary a third predetermined value of said third detecting means.

7. A control method for a current detecting apparatus comprising:
   a first resistor provided between an input terminal and an output terminal;
   switching means provided in parallel with said first resistor;
   control means for controlling said switching means;
   first detecting means for detecting a current flowing in said first resistor or a potential difference which is caused in said first resistor;
   a second resistor provided so as to be serial to at least said switching means; and
   second detecting means for detecting a current flowing in said second resistor or a potential difference which is caused in said second resistor,
   wherein when the current or potential difference that is equal to or larger than a first predetermined value is detected by said first detecting means, said switching means is turned off,
   when the current or potential difference that is equal to or smaller than a second predetermined value is detected by said second detecting means, said switching means is turned on, and
   said first and second detecting means output the detected current or potential difference.

* * * * *

UNITED STATES PATENT AND TRADEMARK OFFICE
CERTIFICATE OF CORRECTION

PATENT NO. : 6,552,562 B2
DATED : April 22, 2003
INVENTOR(S) : Tamiji Nagai

It is certified that error appears in the above-identified patent and that said Letters Patent is hereby corrected as shown below:

<u>Title page,</u>
Item [74], *Attorney, Agent or Firm*, replace "Ronald P. Kajnnaen" with
-- Ronald P. Kananen --.

Signed and Sealed this

Sixth Day of January, 2004

JAMES E. ROGAN
*Director of the United States Patent and Trademark Office*